(12) United States Patent
Zolomy et al.

(10) Patent No.: US 7,755,448 B2
(45) Date of Patent: Jul. 13, 2010

(54) DIFFERENTIAL IMPEDANCE MATCHING CIRCUIT AND METHOD WITH HARMONIC SUPPRESSION

(75) Inventors: Attila Zolomy, Budapest (HU); Peter Onody, Budapest (HU); Tibor Toro, Budapest (HU)

(73) Assignee: Silicon Laboratories Inc., Austin, TX (US)

( * ) Notice: Subject to any disclaimer, the term of this patent is extended or adjusted under 35 U.S.C. 154(b) by 8 days.

(21) Appl. No.: 11/970,237

(22) Filed: Jan. 7, 2008

(65) Prior Publication Data
US 2008/0174383 A1    Jul. 24, 2008

Related U.S. Application Data

(60) Provisional application No. 60/878,774, filed on Jan. 5, 2007.

(51) Int. Cl.
*H03H 7/38* (2006.01)
(52) U.S. Cl. .......................................... 333/32; 333/167
(58) Field of Classification Search .................. 333/32, 333/26, 167; 326/30
See application file for complete search history.

(56) References Cited

U.S. PATENT DOCUMENTS

| | | | |
|---|---|---|---|
| 3,821,655 A | 6/1974 | Fisher | 330/15 |
| 6,529,075 B2 | 3/2003 | Bruck et al. | 330/252 |
| 6,658,265 B1 | 12/2003 | Steel et al. | 455/553.1 |
| 7,034,630 B2 | 4/2006 | Rijks | 333/26 |
| 7,068,122 B2 * | 6/2006 | Weng et al. | 333/26 |
| 7,170,353 B2 * | 1/2007 | Amano | 330/295 |

OTHER PUBLICATIONS

Texas Instruments, "CC2400 2.4 GHz Low-Power RF Transceiver," 2006, 84 pages.

* cited by examiner

*Primary Examiner*—Stephen E Jones
(74) *Attorney, Agent, or Firm*—O'Keefe, Egan, Peterman & Enders LLP

(57) ABSTRACT

Matching network circuits and a method are shown for suppressing a harmonic frequency in a matching network. The circuits and method involve impedance matching first and second differential input nodes to a single ended output node using a first reactive impedance selected to pass a resonant frequency. They also involve suppressing a harmonic frequency of a common mode signal presented at the first and second differential input nodes by providing a series resonance from the first and second differential input nodes to a radio frequency ground potential, where the series resonance is selected to pass the harmonic frequency to the radio frequency ground potential.

3 Claims, 15 Drawing Sheets

DIFFERENTIAL IMPEDANCE MATCHING CIRCUIT AND METHOD WITH HARMONIC SUPPRESSION

CROSS-REFERENCE TO RELATED PATENT APPLICATIONS

This patent application claims the benefit of U.S. Provisional Patent Application No. 60/878,774, filed Jan. 5, 2007, herein incorporated by reference in its entirety.

FIELD OF THE INVENTION

This invention pertains to impedance matching for power amplifiers and, more specifically, baluns circuits.

BACKGROUND OF THE INVENTION

Baluns circuits are used to make a balanced to unbalanced transformation, for impedance matching between the balanced and unbalanced ports, and also suppress the common mode signal at the balanced ports at the $2^{nd}$ harmonic frequency.

One example of a widely known conventional solution (utilized by Chipcon AS of Norway as well) is illustrated in FIG. 2. In the circuit of FIG. 2, LC resonant circuits at the two signal paths of the differential outputs/inputs (O1$b$ 58 and O2$b$ 60) shift +90 and −90 degrees at the fundamental frequency and thus sum the two signal paths in phase at the single ended output 72. In this conventional approach, the matching network is typically difficult to design if a parallel parasitic impedance is present between the differential outputs/inputs, e.g. a transmitter (TX) or receiver (RX) with parallel parasitic RC.

At resonance, which is the normal operating condition, the network should present an optimum antenna impedance at the differential inputs (O1$b$ 58 and O2$b$ 60) in order to deliver maximum power to the unbalanced port 72 in Tx mode or in a reverse way in Rx mode. This optimum antenna impedance has a reactance (usually inductive) that resonates with the TX or RX reactance (usually capacitive) at the operating frequency. The impedance also has a real part that must be properly adjusted to obtain a voltage swing between the differential inputs up to the allowed maximum or if the voltage swing is not maximized to produce a conjugate matched termination for the TX or RX. One problem with this matching network is that it operates well only near to the series resonant frequency of it's LC (L1 62, C1 64) and CL (C2 66, L2 70) arms. Thus, the network shows a high impedance between its differential inputs (O1$b$ 58 and O2$b$ 60) so that the generation of the optimum antenna impedance is difficult if not impossible.

Further, this approach typically requires a highly filtered supply voltage rail Vcc to act as a high quality RF ground, which is illustrated in FIG. 2 as inductor $L_1$ 62 connected to Vcc. In addition, there is no common mode suppression in the solution of FIG. 2. If a common mode $2^{nd}$ harmonic trap is introduced, then the trap will influence the fundamental resonant frequency, which complicates the design process.

Another example of a conventional solution is found in U.S. Pat. No. 6,529,075 for "Amplifier with Suppression of Harmonics" by Yuri Bruck, Gennady Burdo, and Michael Zelikson, which issued Mar. 4, 2003. In this example, an amplifier with differential input and output is shown. Odd and even sample circuits, respectively, are used to sample the odd and even harmonic currents. Using these sample currents, a compensation circuit generates odd and even compensation signals, which are subtracted from the odd and even output harmonic signals in order to reduce their amplitude level. Both the circuit input and output in this example are differential. So the common mode suppression circuit core does not realize a balun function with a single ended output.

Another example of a conventional solution is found in U.S. Pat. No. 3,821,655 for a "High Frequency Amplifier" by Alan J. Fisher, issued Jun. 28, 1974. In this patent, a $2^{nd}$ harmonic trap is used at the differential amplifier output. The trap consists of two series LC resonators, one on each signal path. On each signal path, the LC resonators are formed by the series collector parasitic inductance of the applied bipolar transistor and by a parallel capacitor to the ground. The LC resonators resonate at the $2^{nd}$ harmonic frequency and thus form a short circuit from each signal path to the ground potential. The filtered differential signal is transformed to a single ended signal by an ideal coil balun.

In Fisher, the circuit uses the series parasitic inductances of the transistors with external capacitors. Also, the $2^{nd}$ harmonic suppression and the balun operation (coil balun) are realized with different circuit blocks, which adds cost to the circuit. The solution of Fisher may be applied in the case of transistors with series parasitic output inductance, but is generally not applicable to differential transmitters with parallel parasitic capacitances. Also, the differential transmitter outputs are not matched to the coil balun inputs at the fundamental frequency, which causes losses that reduce power transfer.

Another example of a balun circuit is found in U.S. Pat. No. 7,034,630 for a "Balun transformer and transceiver". In this reference, a balun circuit is described that achieves the balanced-unbalanced transformation by using coupled transmission line elements. It also includes two resonant circuits: one at the single ended and one at the differential side. They generate a band pass filter characteristic at the fundamental frequency.

Still another example of a conventional solution is found in U.S. Pat. No. 6,658,265. In this patent, a dual mode amplifier with a matching and power combining network is described. It is capable of operating in common mode at one frequency band and differential mode at another frequency band. The matching network is configured to maintain the same input and output impedances regardless the type of operation (common mode or differential mode). The matching network is also configured to terminate the second harmonic for each band without affecting the fundamental tone at the other band. This circuit realizes the $2^{nd}$ harmonic suppression and the power combining function, which is the balun function in case of the differential signal, to a single ended antenna with separate circuit blocks. The circuit of this reference appears to have been designed to address complicated applications and the solution itself is, therefore, more complex than is necessary or desirable in simpler or lower cost applications.

BRIEF SUMMARY OF THE INVENTION

One embodiment of a matching network having first 10 and second 12 differential input nodes and a single ended output node 30 includes a first inductor $L_{11}$ 16 coupled between the first differential input node 10 and a common circuit node 28 and a second inductor $L_{12}$ 18 coupled between the second differential input node 12 and the common circuit node 28. A third inductor $L_{DC}$ 14 is coupled between a first power supply rail Vcc and the common circuit node 28. A first capacitor $C_1$ 22 is coupled between the first differential input node 10 and the single ended output node 30. A second capacitor $C_2$ 26 is coupled between the second differential input node 12 and a good Rf ground (which can be even a power supply rail or any other node if it is a good RF ground). A fourth inductor $L_2$ 24 is coupled between the second differential input node 12 and the single ended output node 30. A third capacitor $C_3$ 20 is coupled between the common circuit node 28 and a good Rf ground (which can be even a power supply rail or any other node if it is a good RF ground) such that the third capacitor $C_3$ 20 provides second harmonic suppression of a common mode signal present at the first 10 and second 12 differential input nodes. In an embodiment of an optimization process for the matching network, the values of the first $C_1$ 22 and second $C_2$ 26 capacitors and the first $L_{11}$ 16, second $L_{12}$ 18 and fourth $L_2$ 24 inductors are selected for operation at a predetermined fundamental frequency. The value of the third capacitor $C_3$ 20 is selected to provide a low impedance path to a good RF ground for the common mode signal at a second harmonic frequency.

An embodiment of an inductive matching network includes first 358 and second 360 differential input nodes and a single ended output node 378. A first inductor $L_{DC1}$ 370 is coupled between the first differential input node and a first power supply rail Vcc and a second inductor $L_2$ 376 is coupled between the second differential input node and the single ended output node. A third inductor $L_3$ 312 is coupled between a radio frequency ground node and a common circuit node 364, where an inductance of the third inductor is selected to provide second harmonic suppression of a common mode signal present at the first and second differential input nodes. A fourth inductor $L_{DC2}$ 374 is coupled between the second differential input node and the first power supply rail Vcc. A first capacitor $C_{11}$ 366 is coupled between the first differential input node and the common circuit node 364, a second capacitor $C_{12}$ 368 is coupled between the second differential input node and the common circuit node; and a third capacitor $C_1$ 372 is coupled between the first differential input node and the single ended output node.

In an embodiment of a method for suppressing a harmonic frequency in a matching network, the method calls for impedance matching first and second differential input nodes to a single ended output node using a first reactive impedance selected to pass a resonant frequency. The method also sets forth suppressing a harmonic frequency of a common mode signal presented at the first and second differential input nodes by providing a series resonance from the first and second differential input nodes to a radio frequency ground potential, where the series resonance is selected to pass the harmonic frequency to the radio frequency ground potential.

BRIEF DESCRIPTION OF THE DRAWINGS

Certain exemplary embodiments of the present invention are discussed below with reference to the following figures, wherein.

DETAILED DESCRIPTION OF THE INVENTION

An embodiment of a circuit and method for a new matching balun network is described herein. One function of a matching network is to make a high impedance differential to single ended or unbalanced conversion and form a $2^{nd}$ harmonic trap at the input to suppress the second harmonic.

Figure 1:
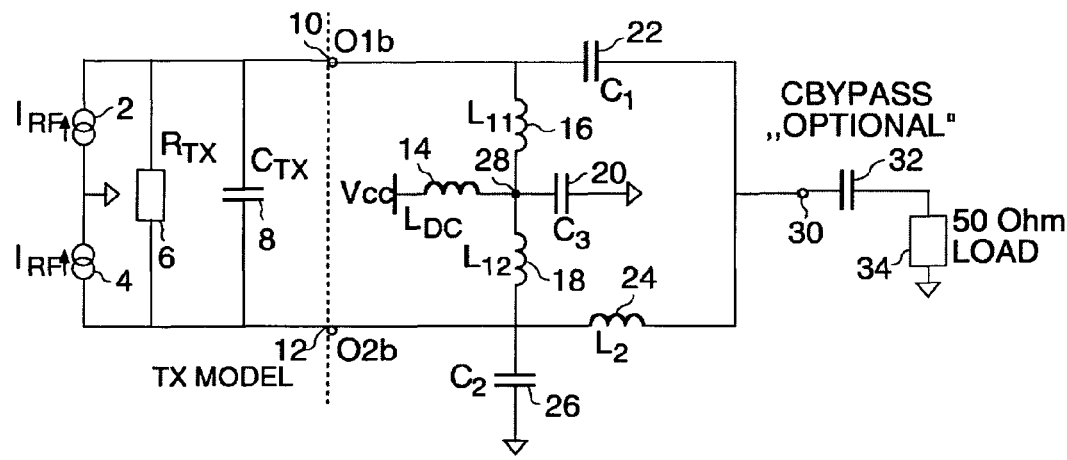
FIG. 1 is a circuit diagram illustrating one exemplary embodiment of a matching network in accordance with the present invention.

One exemplary embodiment as applied to a transmitter (TX) chip model is a parallel RC. This embodiment is illustrated in FIG. 1. The parallel equivalent resistance ($R_{TX}$) 6 depends on the transmitter Q. The concept may also be applied to a receiver (RX) matching baluns. In these embodiments, the jamming signals coming from the single ended side at the $2^{nd}$ harmonic frequency are suppressed.

The embodiment of a baluns circuit shown in FIG. 1 has three basic operational functions. First, the circuit is designed to present an optimum differential antenna impedance to the TX at the fundamental frequency in order to obtain the available maximum level of power transfer from the transmitter to the matching networks differential inputs. This approach works well for conjugate complex matching applications, and also for applications wherein the voltage swing at the differential TX output is limited and thus the real part of the matching network admittance is much higher than the real part of the TX output admittance. In this embodiment, the operation of the transmitter approaches an ideal current generator operation with high generator impedance and minimized internal loss.

The embodiment of FIG. 1 also adds the two differential TX outputs in phase (for this the two out of phase differential outputs are summed in an out of phase way) at the fundamental frequency in order to increase power transfer at the 50 Ohm single ended output 30. Due to the designed phase conditions (i.e. out of phase summation of the two transmit paths) for the differential signals, a common mode noise signal at the fundamental frequency is suppressed.

The circuit of FIG. 1 also has a $2^{nd}$ harmonic trap, which is a series resonant circuit formed by the $L_{11}$ 16, $L_{12}$ 18 inductances and the $C_3$ 20 capacitor. This trap presents a short circuit to the common mode signal at the $2^{nd}$ harmonic frequency. Since the common mode signal is typically dominant at the $2^{nd}$ harmonic frequency for differential amplifiers, the trap obtains significant second harmonic suppression.

In FIG. 1, the transmitter TX drives the balun in a differential mode (i.e. the two current generators 2, 4 have identical direction). The common mode drive of the balun is illustrated in the embodiment of FIG. 22, which shows a configuration in which the two current generators 300, 302 are working in opposite direction.

The circuit element values are determined by a method of design optimization. First, the differential mode operation is optimized at the fundamental frequency. This step is further described below. At this step, the values of circuit elements $C_1$ 22, $C_2$ 26, $L_{11}$ 16=$L_{12}$ 18, and $L_2$ 24 are selected to optimize operation at the fundamental frequency.

In the next step, the value of capacitor value $C_3$ 20 is selected to adjust the common mode trap at the second harmonic frequency. In this approach, the behavior at the fundamental frequency can be designed separately from the $2^{nd}$ harmonic suppression trap. Both steps (especially the second one) require simple and short optimization efforts.

Figure 22:
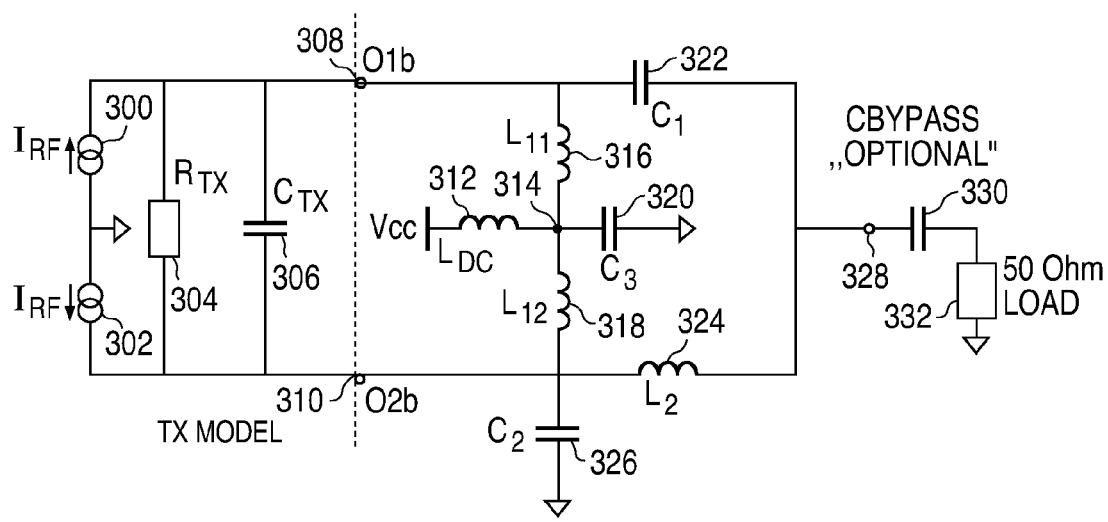
FIG. 22 is a circuit diagram of the circuit of FIG. 18 with one of the current generators 302 reversed for the common mode simulation.
Figure 23:
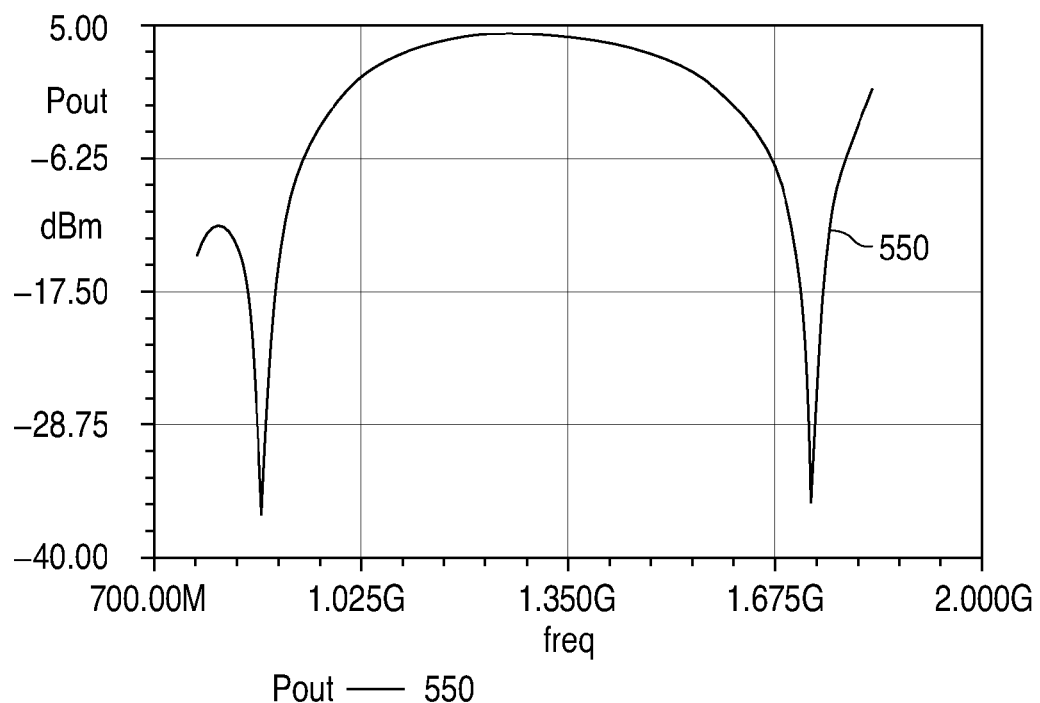
FIG. 23 is a response curve illustrating the response of the circuit of FIG. 22 for the common mode $2^{nd}$ harmonic signal.

FIG. 23 is a simulation output illustrating the common mode suppression both in the fundamental and the $2^{nd}$ harmonic frequency of the circuit in FIG. 22. Here, the power at the 50 Ohm output is simulated as if a pure common mode signal is presented at the differential inputs. As the graph of FIG. 23 demonstrates, the common mode suppression both at the fundamental and second harmonic is high.

Three different matching network configurations that may be used for high impedance differential to single ended 50 Ohm transformation are analyzed below for comparison purposes. These networks are the conventional configurations of FIGS. 2 and 10 and an embodiment of the present invention shown in FIG. 1. The elements used in the following simulation analysis of these matching networks are ideal loss free elements, since the purpose of this comparison is to illustrate the main effects on end behavior. A simulation with real lossy elements is not presented here. The elements are also modeled as linear devices, so simple AC analysis was used.

The parallel equivalent resistance ($R_{TX}$) 6 in the transmitter model of FIG. 1 depends on the transmitter Q. With a typical 0.18 um CMOS technology, the Q is assumed to be 1.5 KOhm at 868 MHz. The parallel equivalent capacitance ($C_{TX}$) 8 is assumed to be 2 pF. The assumed targeted power is +20 dBm to the antenna. The assumed voltage magnitude on one output is assumed to be 2.5V. So the differential magnitude is 5V and, thus, the total peak to peak differential swing is 10V.

With this maximum voltage swing the required current magnitude is 40 mA and the required equivalent parallel resulting resistance (e.g. the reciprocal of the real part of the so called optimum antenna admittance together with the parallel 1.5 KOhm of the TX) is 125 Ohm. From this, the reciprocal of the real part of the so called optimum antenna admittance should be 142 Ohm.

During the optimization process, the matching networks were configured to present this impedance to the transmitter output and also an inductive reactance, which is in resonance with the $C_{TX}$ 8 at 868 Mhz.

Figure 2:
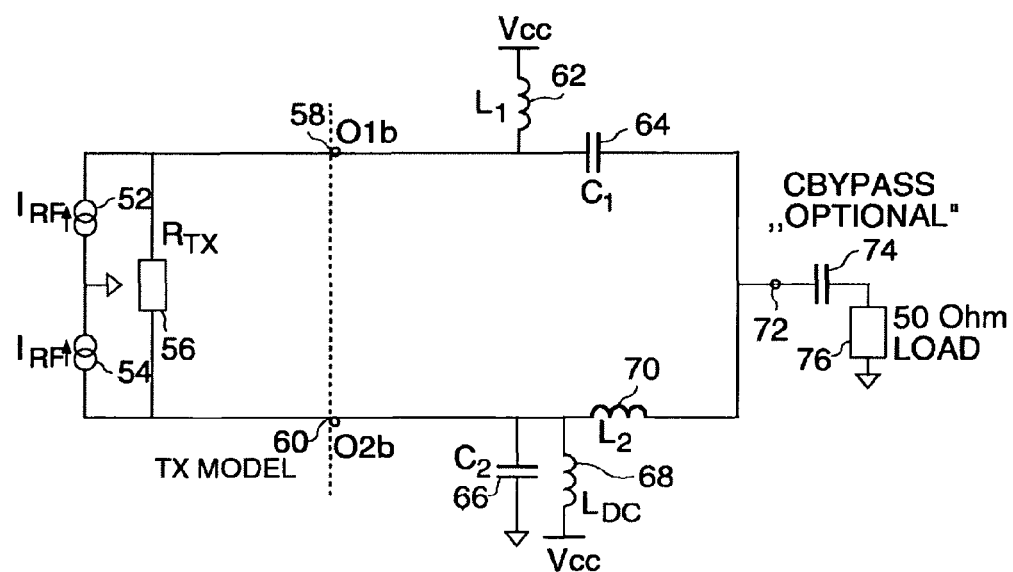
FIG. 2 is a circuit diagram illustrating one example of a conventional matching network.

The matching network of FIG. 2 yields some undesirable results. It is difficult to design even for acceptable fundamental operation, and also the resulting operation is not stable in case of technological spreading. It has no $2^{nd}$ harmonic suppression.

Figure 10:
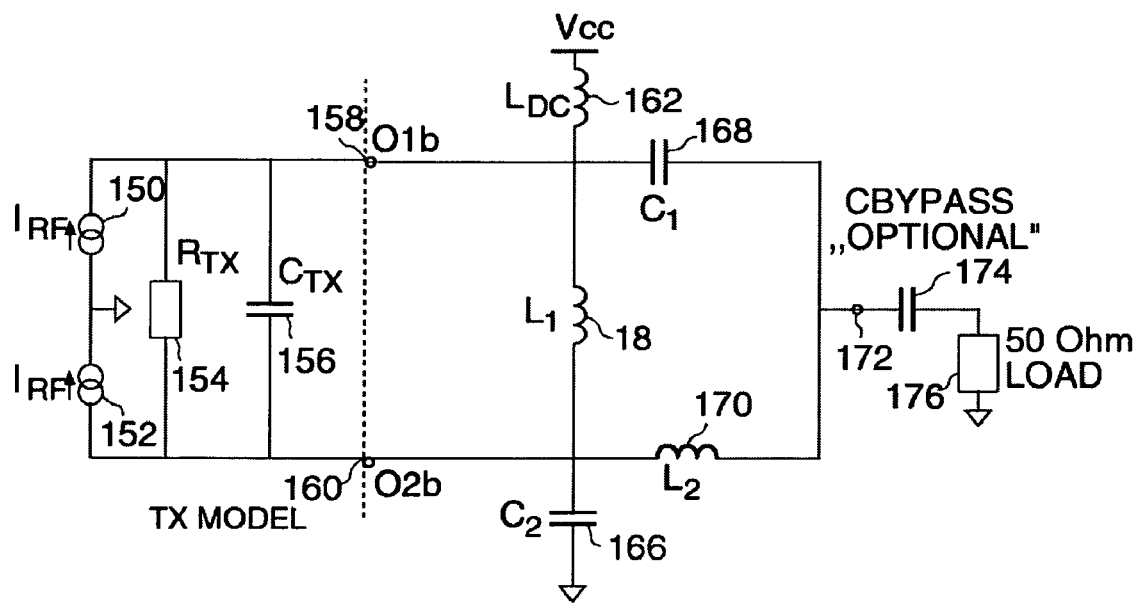
FIG. 10 is a circuit diagram illustrating another example of a conventional matching network.

The matching network of FIG. 10 is a modification of the network of FIG. 2, which is easier to realize as no Vcc rail with good RF ground is required, easier to design as its characteristic is more suitable for differential operation at the fundamental frequency. However, no $2^{nd}$ harmonic suppression is achieved.

The matching network of FIG. 1 provides many of the features of FIG. 10, but includes an additional capacitance that provides strong suppression of the common mode at the second harmonic as well. The value of this capacitance can be designed easily for $2^{nd}$ harmonic suppression and also it is independent from the fundamental operation design.

An example of an optimization process for the matching network of FIG. 2 will now be discussed. In this optimization, the transmitter capacitance ($C_{TX}$) and the DC feed inductance ($L_{DC}$) was eliminated to have a more simple structure and, in this way, shorten the optimization cycles.

Element values for this optimization example are given in Table 1.

TABLE 1

| $R_{TX}$ | $L_1$ | $C_1$ | $L_2$ | $C_2$ |
|---|---|---|---|---|
| 1.5K | 16.683 nH | 2.177 pF | 15.465 nH | 2.33 pF |

In this example of optimization of the matching network of FIG. 2, the network was optimized for fundamental operation. The steps are as follows:
 1. The current generators 52, 54 were deactivated and an S parameter port is connected to the single ended side 72 as a generator.
 2. The $R_{TX}$ 56 was replaced by the optimum equivalent parallel antenna resistance, which is 142 Ohm in the exemplary case of a 10V maximum peak to peak voltage swing and the targeted +20 dBm power to the antenna.

3. S11 is minimized and the voltages at the differential side (O1b 58, O2b 60) should be equal in magnitude and the phase should be +90° and −90°. In this way, the matching network circuit is configured to present the optimal antenna impedance to the transmitter TX and offers good balun function as well.

Figure 3:
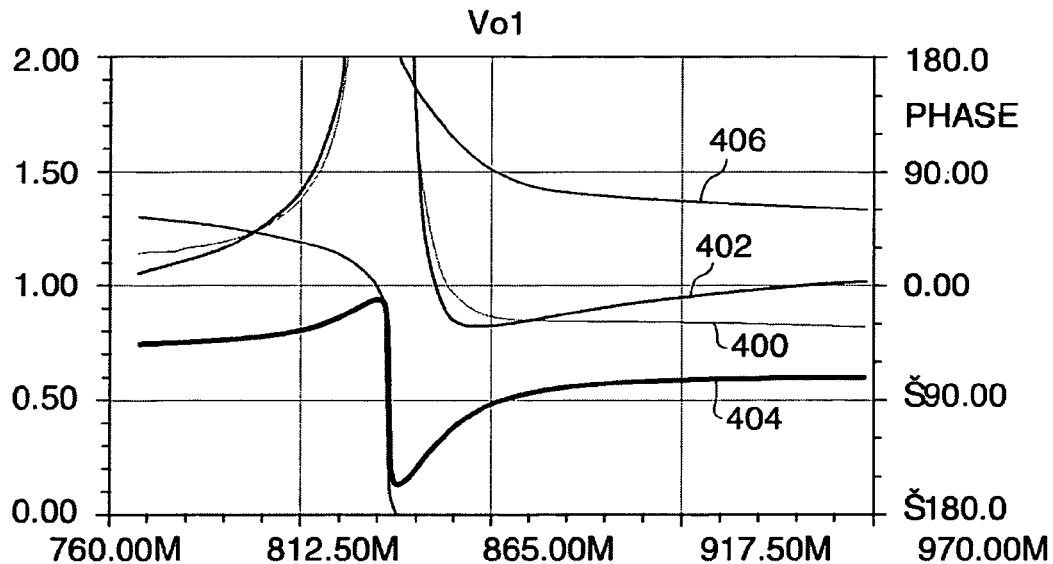
FIG. 3 is a graph that shows the simulated magnitudes and phases on the differential outputs O1b and O2b in FIG. 2 after several optimization cycles using a conventional optimization algorithm.

FIG. 3 is a graph that shows the simulated magnitudes 400, 402 and phases 404, 406 on the differential IC outputs (denoted by O1b 58 and O2b 60 in FIG. 2) after several optimization cycles using a conventional optimization algorithm. The result may not be optimum, but it was achieved after significant optimization effort, despite the simpler structure. As can be observed in the graph, the optimization has not adjusted the resonance of the circuit to 868 MHz. One reason may be that, at resonance, the impedance shown by the matching network at it's differential port is very high and thus no good matching to the optimum antenna impedance was possible to achieve. Instead, the optimization process adjusted the resonance to a lower frequency to achieve equal but lower voltage amplitudes and +−90 degree phase shift with impedance matching at 868 Mhz. But it is not an optimum solution as the phase change vs. frequency is opposite at the two differential nodes. Thus, for example a technological variation which changes the resonant frequency will generate a big phase error i.e. the phase difference between the O1b 58 and O2b 60 voltages will strongly deviates from the desired 180 degree. It cause output power and common mode suppression degradation at the fundamental frequency.

Figure 4:
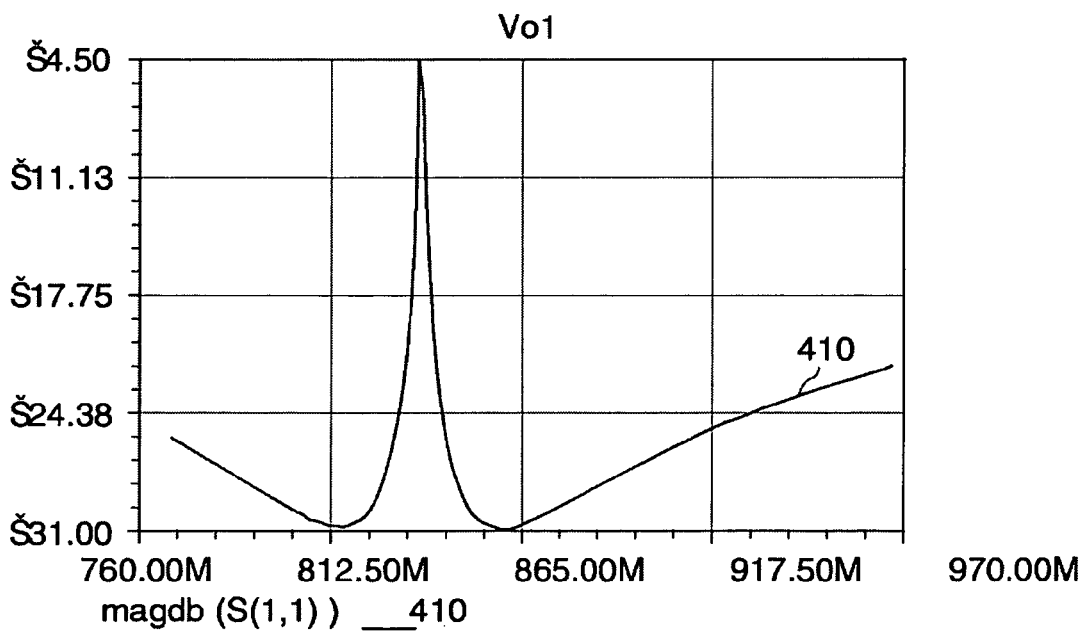
FIG. 4 is a graph that shows the S11 of the circuit of FIG. 2.

FIG. 4 is a graph that shows the S11 of the circuit of FIG. 2 during the optimization. It has two minima. At resonance, the matching is poor, so if the single ended side is terminated by 50 Ohms, the matching network does not present the optimum antenna impedance at its differential port.

After this optimization process the optimum equivalent parallel antenna resistance should be removed and the $R_{TX}$ 56 should be put back in the TX for a final simulation. In this final simulation, the S11 of the 50 Ohm single ended port may be less optimal as compared to the case when the matching network was forced to show the optimum antenna impedance between its differential inputs and now it is terminated with the TX impedance.

Figure 5:
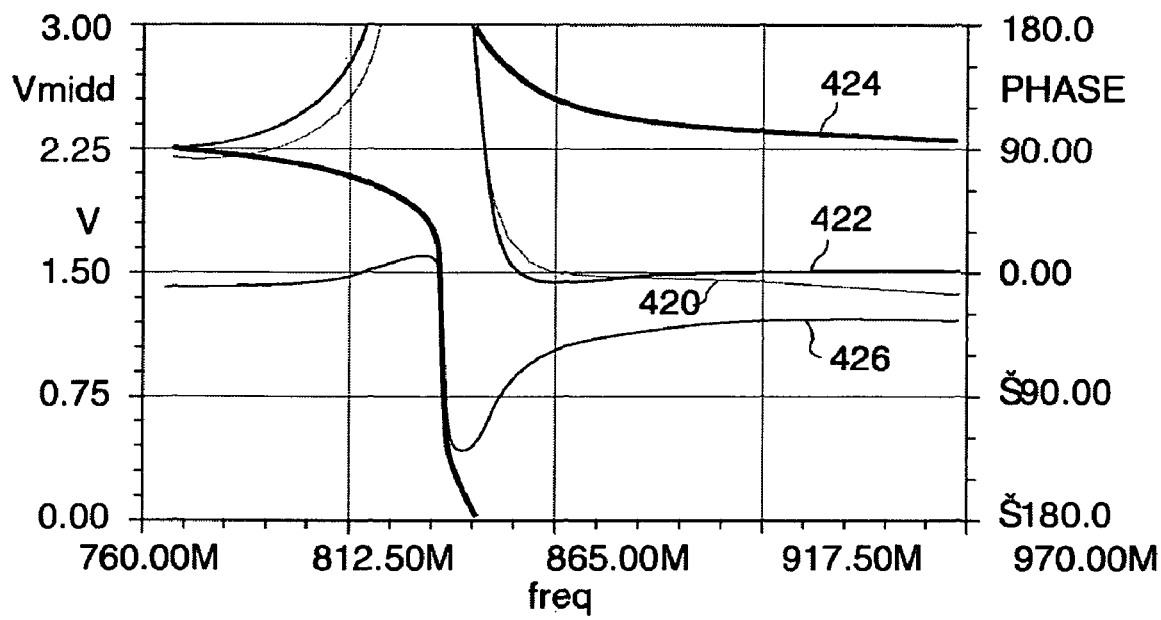
FIG. 5 is a graph illustrating the voltages at the differential side (O1b 58, O2b 60) of the circuit of FIG. 2 if the resistor $R_{TX}$ 56 is put back.

But, the reduced S11 is not a problem in practice because the aim is not the conjugate match but to deliver the available maximum power from the TX to the single ended port. If the TX voltage swing is maximized and the TX current magnitude is high enough, then the optimum antenna impedance to which the TX delivers the maximum power is not necessarily equal to the complex conjugate of the TX impedance as the TX can work as a current generator with lower internal losses. FIG. 5 is a graph illustrating the voltages 420, 422 at the differential side (O1b 58, O2b 60) of the circuit of FIG. 2 if the resistor $R_{TX}$ 56 (1.5K) is put back. The S-parameter port at the single ended side 72 is deactivated and the current generators 52, 54 at the differential side are activated (40 mA RF current magnitude). As can be observed in FIG. 5, the resistance $R_{TX}$ 56 has influence on the phase and magnitude characteristic, but the quality of the operation is not improved.

Figure 6:
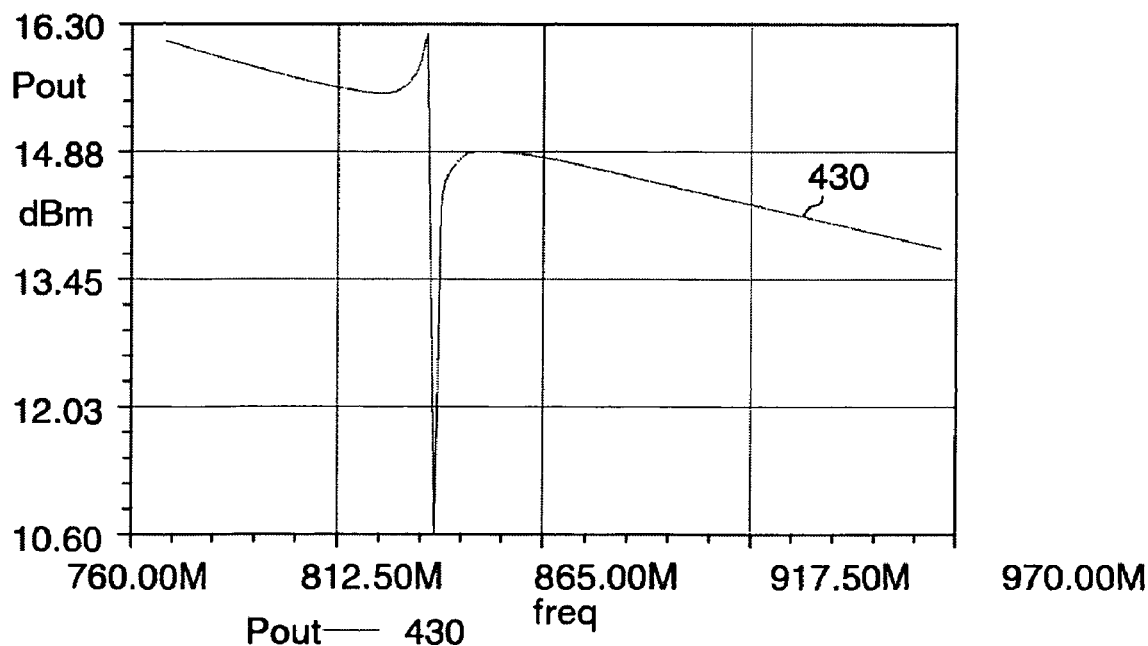
FIG. 6 is a graph illustrating the fundamental output power of the circuit of FIG. 2.

FIG. 6 is a graph illustrating the fundamental output power of the circuit of FIG. 2. The graph shows that the output power is 14.7 dBm at 870 MHz, which is lower than the targeted +20 dBm due to improper operation. The power is much higher at 837 MHz where the resonance occurs, but, due to the non optimized conditions, it is far from the targeted +20 dBm.

Figure 7:
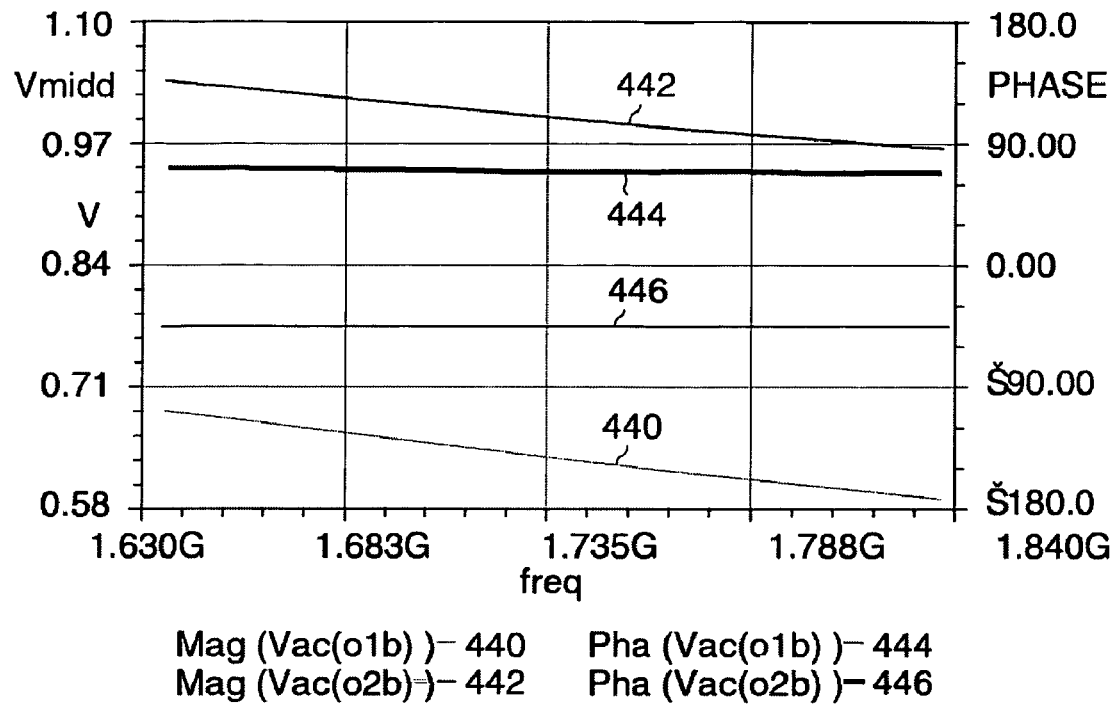
FIG. 7 is a graph illustrating the operation of the matching network of FIG. 2 at the second harmonic frequency.
Figure 8:
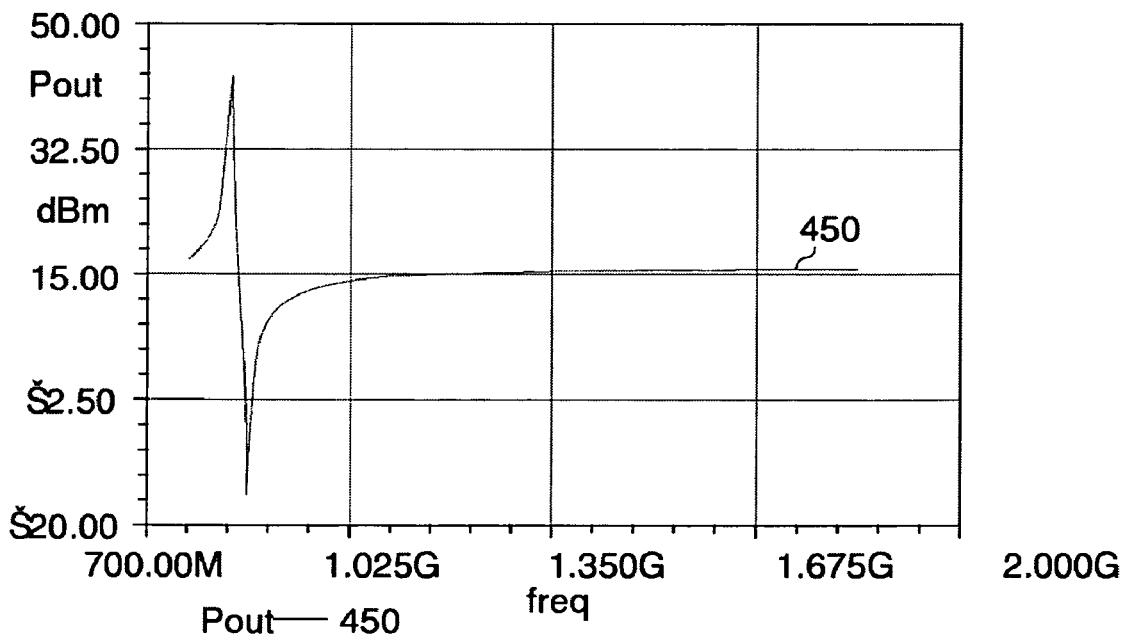
FIG. 8 is a graph that illustrates the response of the matching network of FIG. 2 with respect to the common mode second harmonic.
Figure 9:
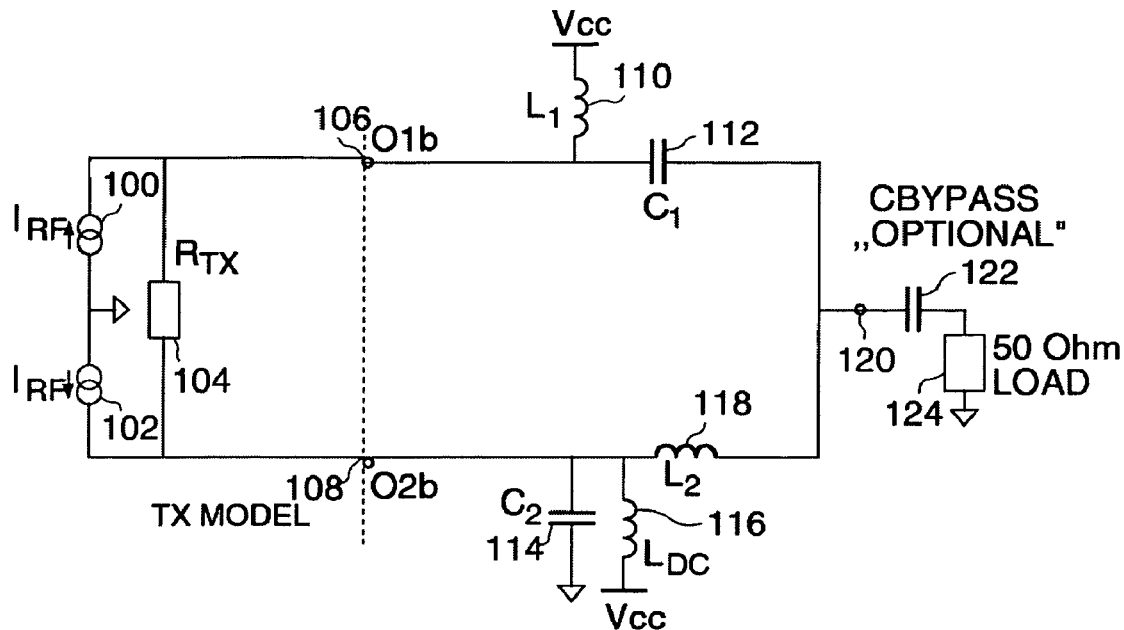
FIG. 9 is a circuit diagram of the model used for the common mode simulation of FIG. 8, wherein one of the current generators 102 was reversed with respect to FIG. 2.

FIG. 7 is a graph illustrating the operation of the matching network of FIG. 2 at the second harmonic frequency, which is not optimal. The graph shows the O1b 58 and O2b 60 voltages 440, 442 at the $2^{nd}$ harmonic frequency. Note that the observed magnitudes are far from equal and also that the phase difference is far from 180°. This demonstrates that the matching network of FIG. 2 does not suppress the common mode second harmonic. This lack of suppression can also be observed in FIG. 8, where the common mode suppression versus frequency is shown. Note that for the common mode simulation of FIG. 8, one of the current generators 102 was reversed, as is illustrated in the circuit diagram of FIG. 9. The common mode in the fundamental frequency is suppressed, but a sharp maximum is also found in close proximity to the fundamental frequency. This maximum is due to bad phase resonance conditions. So, in a case of element value spreading, even common mode gain can occur instead of suppression.

The matching network of FIG. 2 is relatively difficult to design and optimize. The phase characteristic can be tuned to have nearly 180° difference, but it's frequency characteristic is not optimal for differential operation. It is unstable and sensitive to element value spreading. The targeted +20 dBm output power was not achieved in the simulation. Also, the circuit does not adequately suppress the common mode at the $2^{nd}$ harmonic frequency. Moreover, the common mode suppression and the output power at the fundamental frequency is very element sensitive.

A simulation was also performed on the conventional matching network shown in FIG. 10. In this simulation, the transmitter capacitance 156 was put into the circuit. Despite the more complicated TX structure, the final solution was found with a relatively short optimization cycle compared to the circuit of FIG. 2.

The optimization process performed on the matching network FIG. 10 was optimized for fundamental operation as follows:

1. The current generators 150, 152 were deactivated and an S parameter port is connected to the single ended side 172 as a generator.
2. The $R_{TX}$ 154 was replaced by the optimum equivalent parallel antenna resistance, which is 142 Ohm in case of 10 V max. peak to peak voltage swing and the targeted +20 dBm power to the antenna.
3. S11 is minimized and the voltages at the differential side (O1b 158, O2b 160) should be equal in magnitude and the phase should be +90° and −90°. By this way the matching circuit is forced to show the optimum antenna impedance to the TX and shows a good balun function as well.

Figure 11:
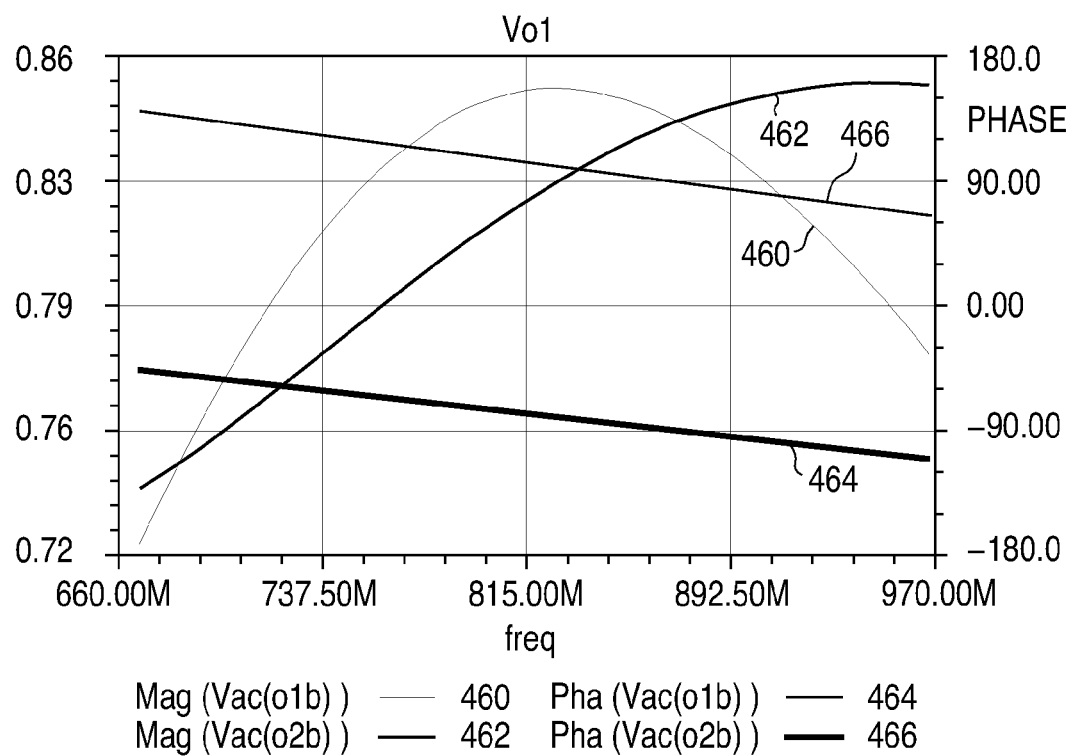
FIG. 11 is a frequency response graph illustrating the simulated magnitudes and phases on the differential IC outputs O1b 158 and O2b 160 in FIG. 10.

FIG. 11 is a frequency response graph illustrating the simulated magnitudes 460, 462 and phases 464, 466 on the differential IC outputs, which are denoted by O1b 158 and O2b 160 in FIG. 10. As shown in the graph, after a short optimization process, the magnitudes are nearly equal and the phases are nearly +90° and −90°. So the balun function is good. The phase difference is much more stable than in the previous cases as the phase characteristics of the two differential output voltages are parallel (i.e. the gradient has the same sign).

Figure 12:
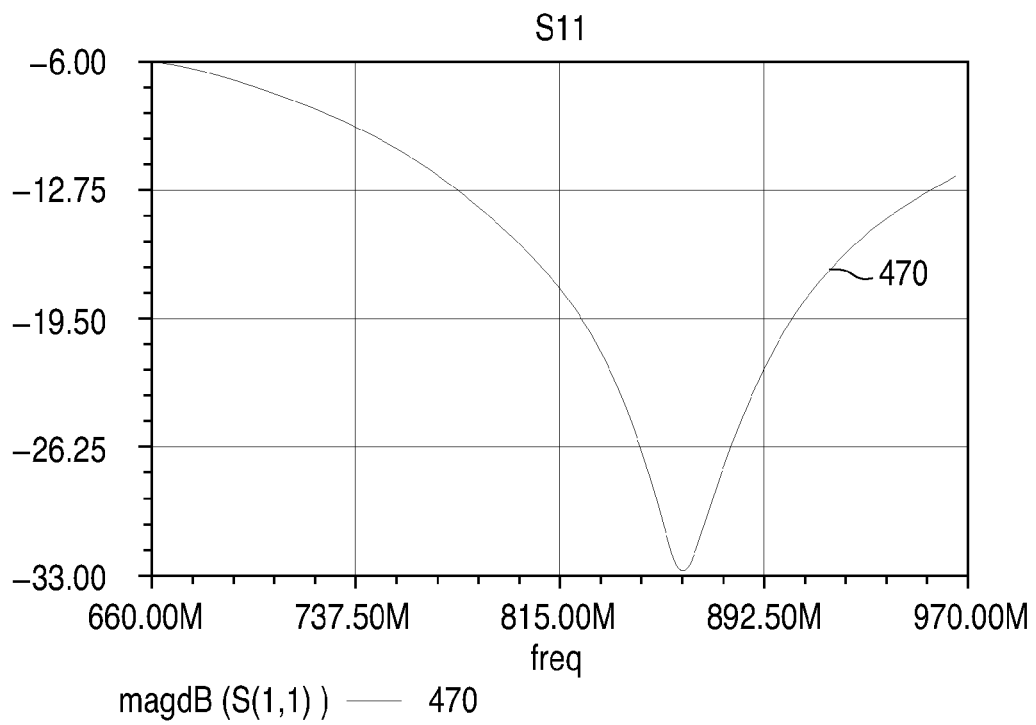
FIG. 12 is a graph that shows the S11 for the circuit of FIG. 10.

FIG. 12 is a graph that shows the S11 for the circuit of FIG. 10. It has only one minima at the operation frequency, so that, if the single ended port 172 is terminated by 50 Ohm, the matching network will present a substantially optimum antenna impedance between its differential inputs.

Figure 13:
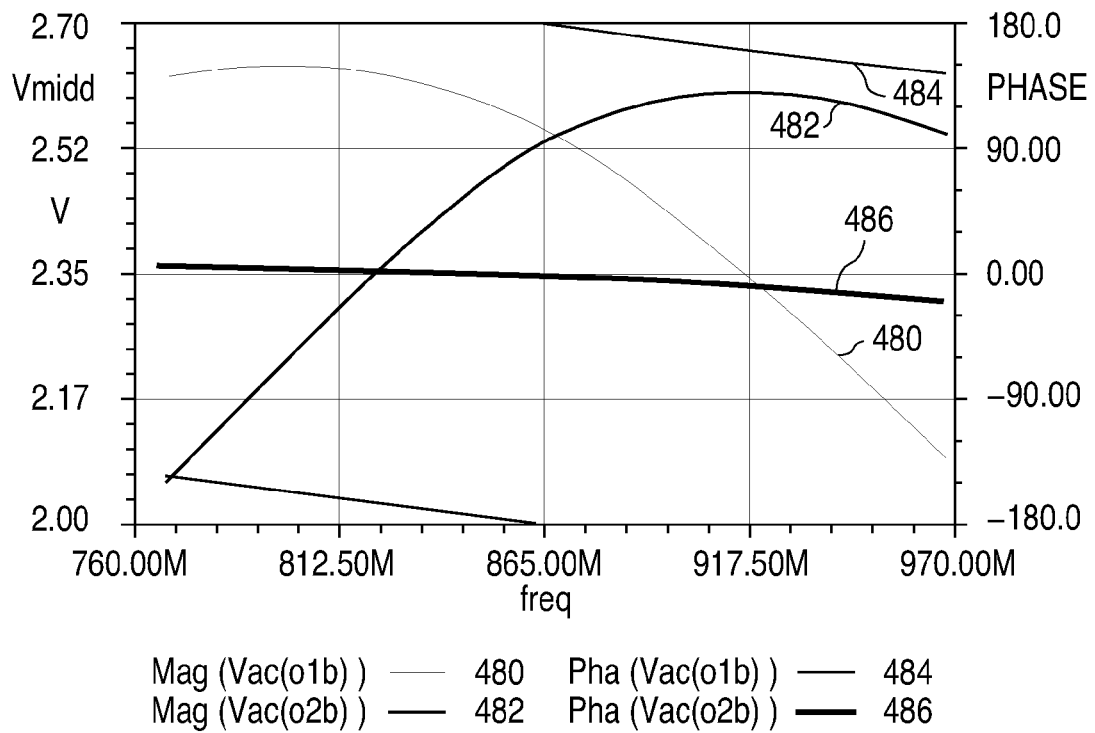
FIG. 13 is a graph that illustrates the voltages at the differential outputs O1b and O2b of FIG. 10 if the $R_{TX}$ 154 is put back, the S-parameter port at the single ended side is deactivated and the current generators 150, 152 at the differential side are activated.

FIG. 13 is a graph that illustrates the voltages 480, 482 at the differential side (O1b 158, O2b 160) if the $R_{TX}$ 154 (1.5K) is put back, the S-parameter port at the single ended side 172 is deactivated and the current generators 150, 152 at the differential side are activated (40 mA RF current magnitude). As can be seen in the graph, the magnitudes are nearly equal and the phase difference is also 180°. So the common mode suppression at the fundamental frequency is good and also the fundamental power is high. The simulation demonstrates that the circuit of FIG. 10 performs better at the fundamental frequency than the matching network of FIG. 2.

Figure 14:
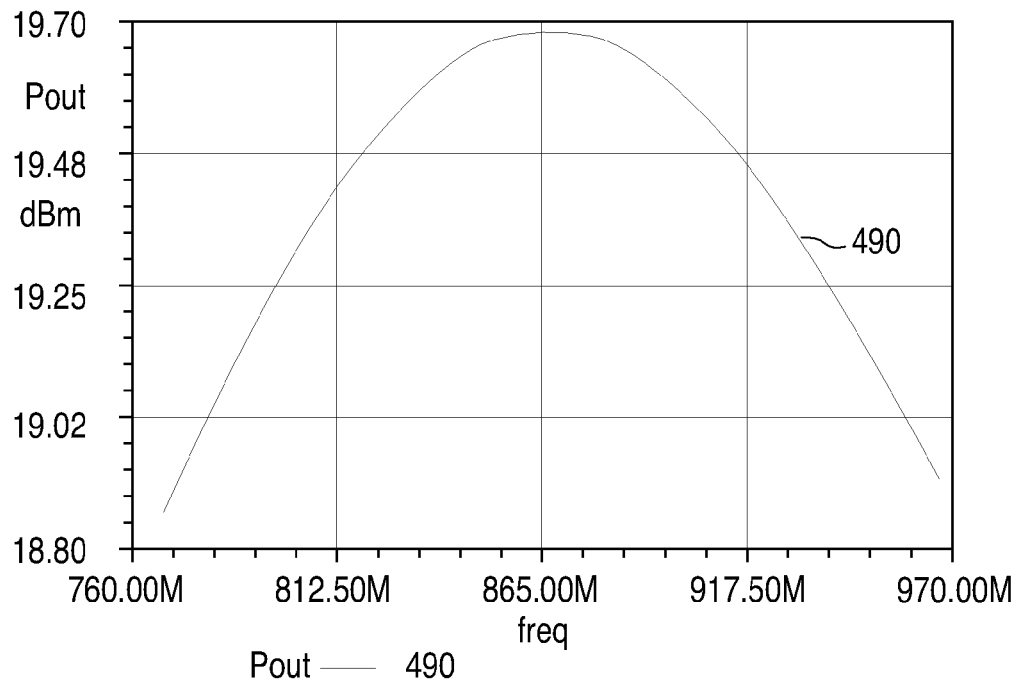
FIG. 14 is a frequency response graph that illustrates the fundamental power output for the circuit of FIG. 10.

FIG. 14 is a frequency response graph that illustrates the fundamental power output for the circuit of FIG. 10. The power output is only slightly lower than +20 dBm due to slight phase (<1°) and magnitude (<5 mV) errors.

Figure 15:
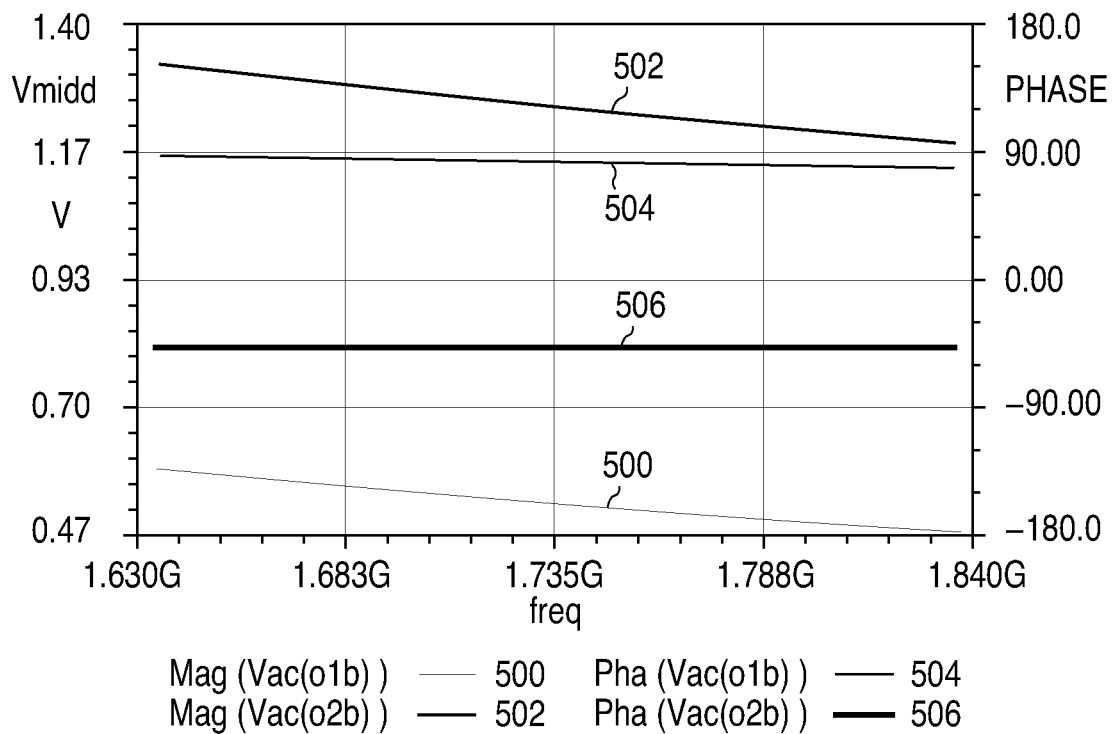
FIG. 15 is a graph illustrating the voltages at O1b 158 and O2b 160 voltages of the matching network of FIG. 10 at the second harmonic frequency.
Figure 16:
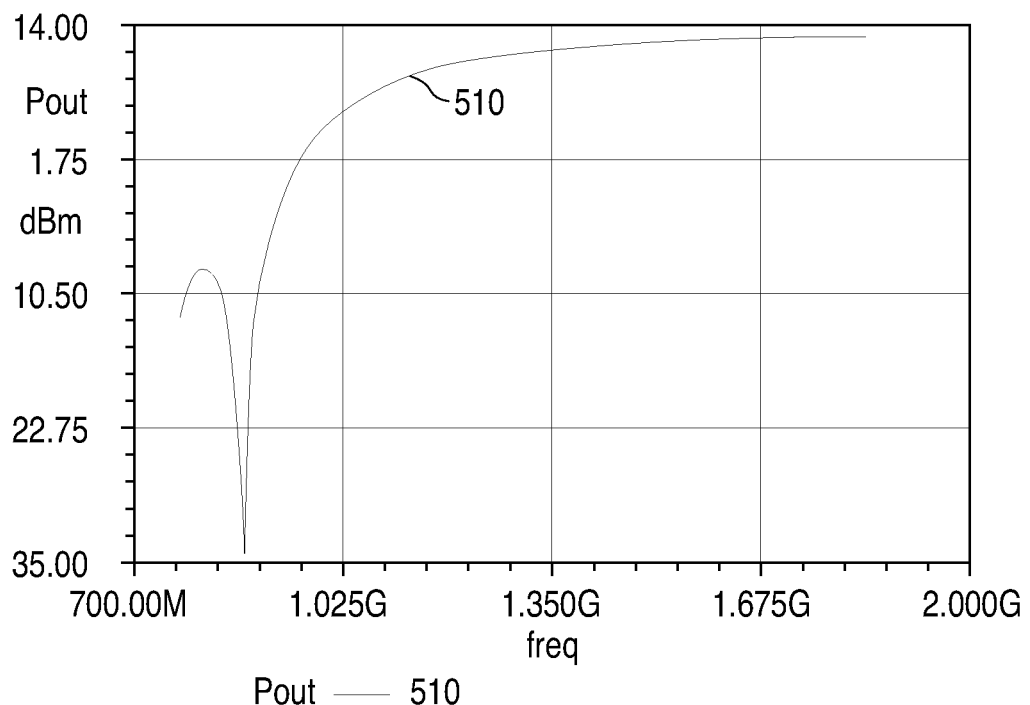
FIG. 16 is a graph illustrating the response at the common mode second harmonic for the matching network of FIG. 10.
Figure 17:
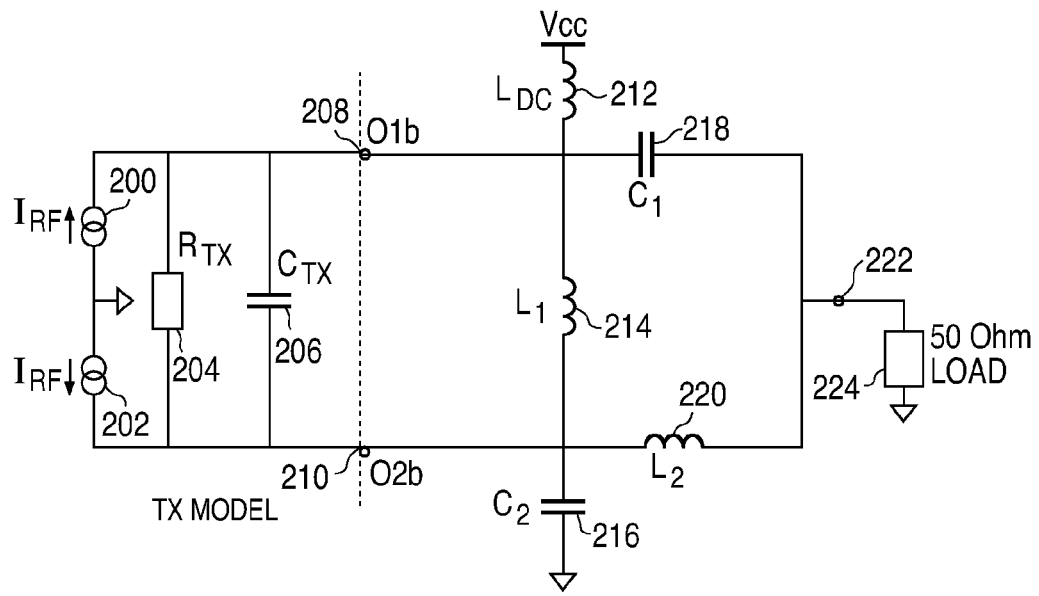
FIG. 17 is a circuit diagram of the model used for the common mode simulation of FIG. 16, wherein one of the current generators 202 was reversed.

FIG. 15 is a graph illustrating that the performance of the matching network of FIG. 10 at the second harmonic frequency is non optimal. The graph shows the O1b and O2b voltages 500, 502 at the $2^{nd}$ harmonic frequency. Note that the observed magnitudes are far from equal and also that the phase difference is far from 180°. Thus, the graph demonstrates that the matching network of FIG. 10 does not adequately suppress the common mode second harmonic. This poor suppression may also be observed in FIG. 16, where the second harmonic suppression is shown. For the common mode simulation of FIG. 16, one of the current generators 152 of the circuit of FIG. 10 was reversed, as shown in FIG. 17 (generator 202).

If the circuit of FIG. 10 is further optimized to second harmonic, improvement can be achieved, however, the result is still sub-optimal. Optimization for second harmonic suppression requires the addition of another element, which is discussed below with regard to the solution of FIG. 1.

In summary, the matching network of FIG. 10 is relatively easy to design and optimize for the fundamental. The phase characteristic can be tuned to have nearly 180° difference and it's frequency characteristic is substantially optimal for differential operation. Also, the targeted +20 dBm output power was nearly achieved. Realization is also easier as no Vcc trail with good Rf ground properties is required. However, this matching network cannot adequately suppress the common mode at the $2^{nd}$ harmonic frequency.

Figure 18:
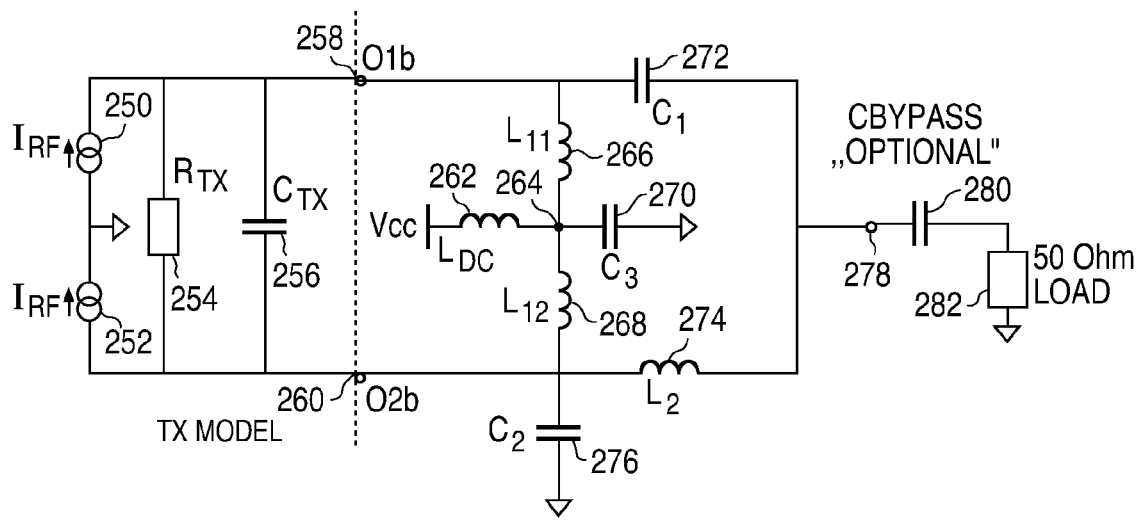
FIG. 18 is another circuit diagram for an embodiment of a matching network according to the present invention.

Turning now to the analysis of an embodiment of the present invention, a circuit diagram of the 868 MHz matching network with $2^{nd}$ harmonic suppression is shown in FIG. 18. While the circuit of FIG. 18 is similar to the circuit of FIG. 10, the inductor $L_1$ 164 is effectively cut into two parts (denoted by $L_{11}$ 266 and $L_{12}$ 268) and the middle point 264 is connected to a radio frequency ground potential through capacitor $C_3$ 270. The function of capacitor $C_3$ 270 is to form a series resonance together with the $L_{11}$ 266 and $L_{12}$ 268 inductors at the $2^{nd}$ harmonic frequency, and create a short circuit for the common mode, which is dominant at the $2^{nd}$ harmonic frequency. In this way, significant $2^{nd}$ harmonic suppression can be achieved.

The design is simple to apply because the $2^{nd}$ harmonic suppression with capacitor $C_3$ 270 can be designed independently of the fundamental behavior. As a result, the basic design procedure at the fundamental frequency is basically the same as it was for the circuit described above, e.g. S11 is minimized if the optimum antenna parallel equivalent resistance is used instead of $R_{TX}$ 254 in the chip model and the voltages at the differential side (O1b 258, O2b 260) should be equal in magnitude and the phase should be +90 and −90 degree. Only the middle node 264 between $L_{11}$ 266 and $L_{12}$ 268 should be connected to an RF ground by putting an ideal decoupling capacitor (e.g. a high value ideal capacitor) instead of $C_3$ 270. After S11 and differential magnitude and phase separation are optimized, then $2^{nd}$ harmonic suppression can be achieved by putting back the $C_3$ 270 instead of the decoupling capacitor into the simulation and adjusting the capacitance $C_3$ 270 to be in resonance at the $2^{nd}$ harmonic frequency with the $L_{11}$ 266 and $L_{12}$ 268 inductances.

Note that the element values of the circuit of FIG. 18 can be different from those of the matching network of FIG. 10 without $2^{nd}$ harmonic suppression, as shown in Table 2, due to the different position of the DC feed inductance ($L_{DC}$) 262, and due to the fact that the middle node between $L_{11}$ 266 and $L_{12}$ 268 is forced to RF ground during the fundamental optimization. Also it should be noted that $L_{11}$ and $L_{12}$ are not necessarily equal.

Figure 19:
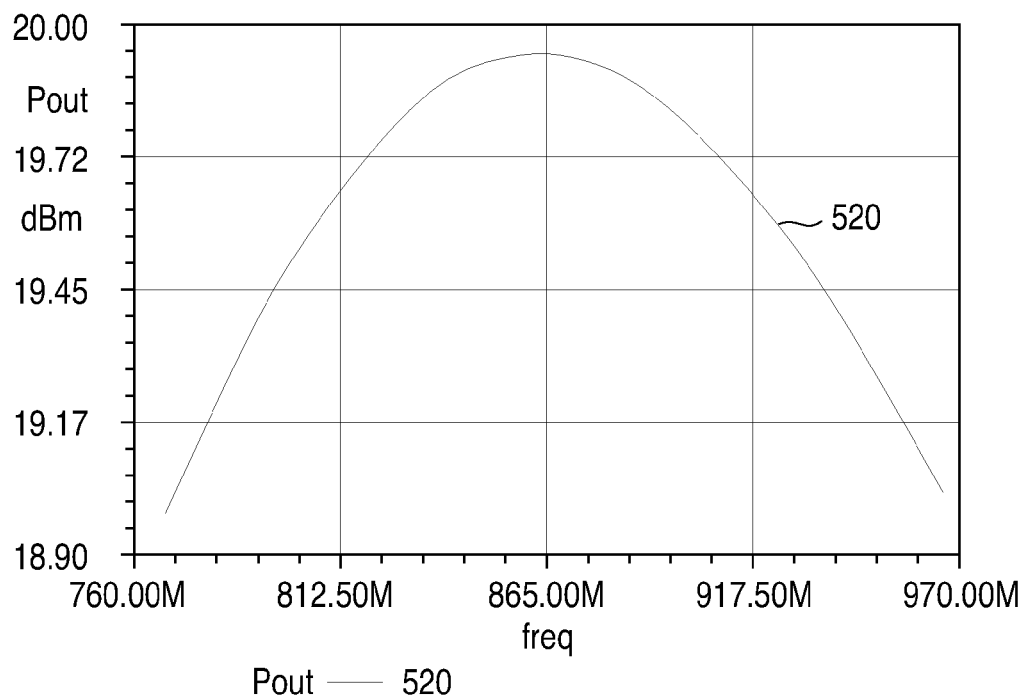
FIG. 19 is a frequency response graph that illustrates the fundamental power output for the circuit of FIG. 18.
Figure 20:
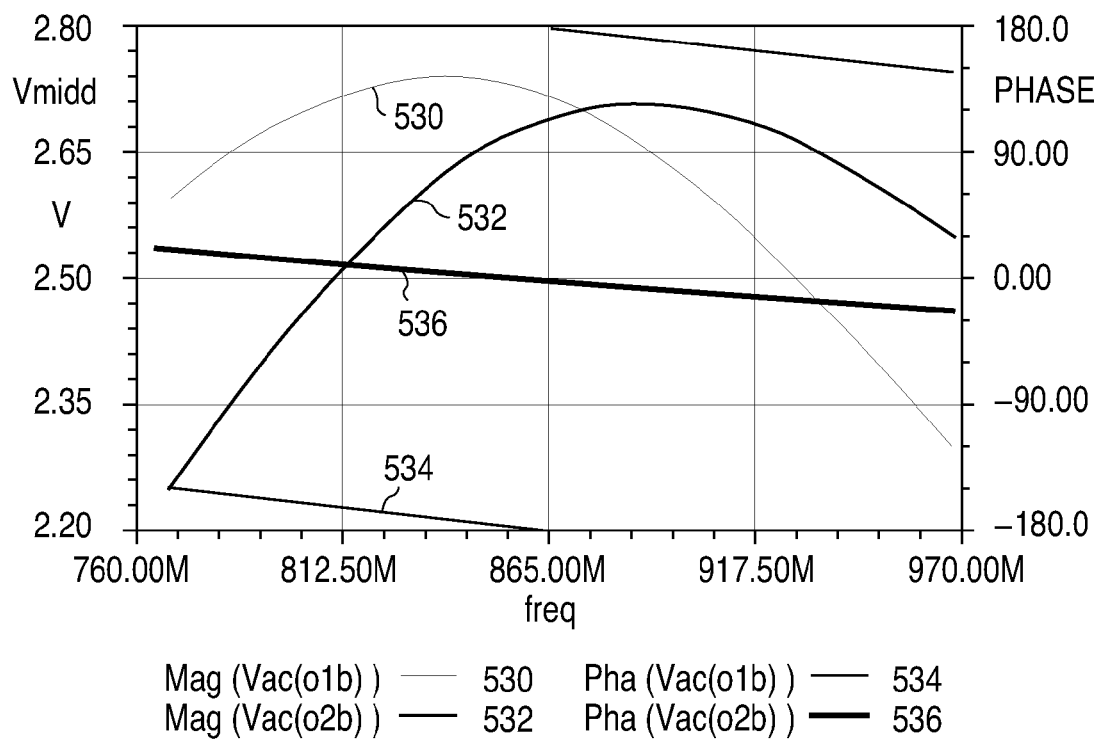
FIG. 20 shows the simulated voltage magnitude and phase on the differential outputs O1b 258 and O2b 260 in FIG. 18 when the transmit current generators 250, 252 are active.

FIG. 19 is a frequency response graph that illustrates the simulated fundamental power transfer to the 50 Ohm output 282 of the circuit shown in FIG. 18. The targeted power was +20 dBm. The slight difference is due to the slight phase (<0.5°) and amplitude errors in the simulation. FIG. 20 shows the simulated voltage magnitude 530, 532 and phase 534, 536 on the differential IC outputs (denoted by O1b 258 and O2b 260 in FIG. 18) when the TX current generators 250, 252 are active. As can be seen, the magnitude of the voltages is equal and the phase difference is 180 degrees.

Figure 21:
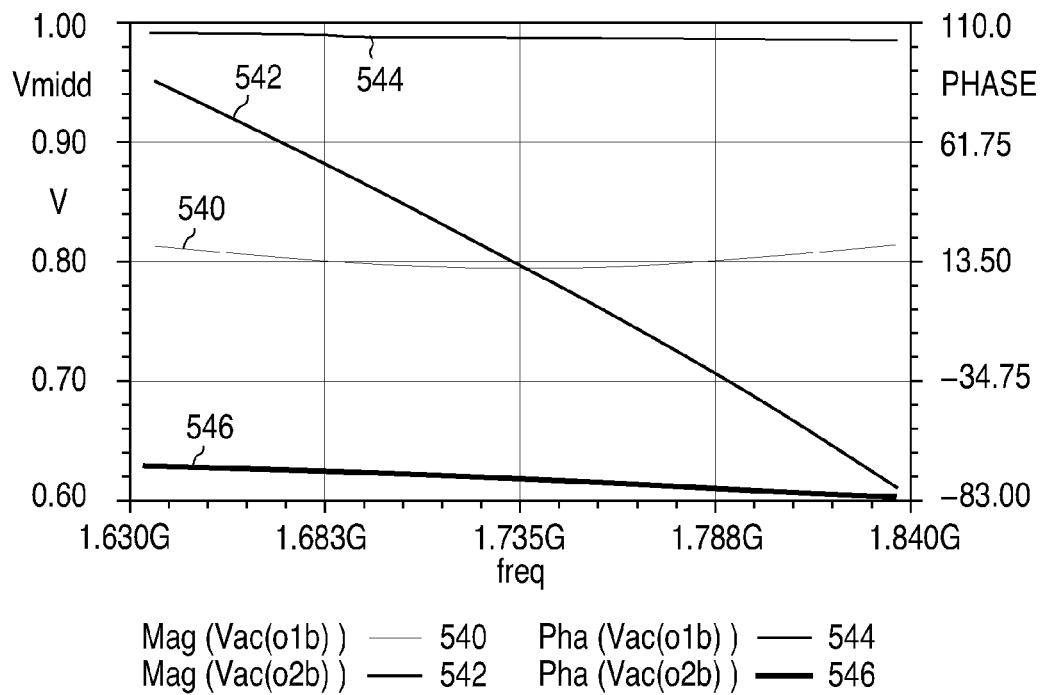
FIG. 21 shows the response curve for the circuit of FIG. 18 at the $2^{nd}$ harmonic frequency (1736 GHz)

FIG. 21 shows a simulated response curve for the circuit of FIG. 18 at the $2^{nd}$ harmonic frequency (1736 GHz). Note that the amplitudes are equal and the phase difference is ~180°. Thus, the common mode $2^{nd}$ harmonic signal is suppressed. The common suppression is further investigated by reversing one of the current generators 302, as illustrated in FIG. 22. The resulting common mode output power is shown in FIG. 23. High levels of suppression can be observed both in the fundamental and second harmonics. Thus, the power of the second harmonic will be low because it mostly consists of a common mode signal.

Figure 24:
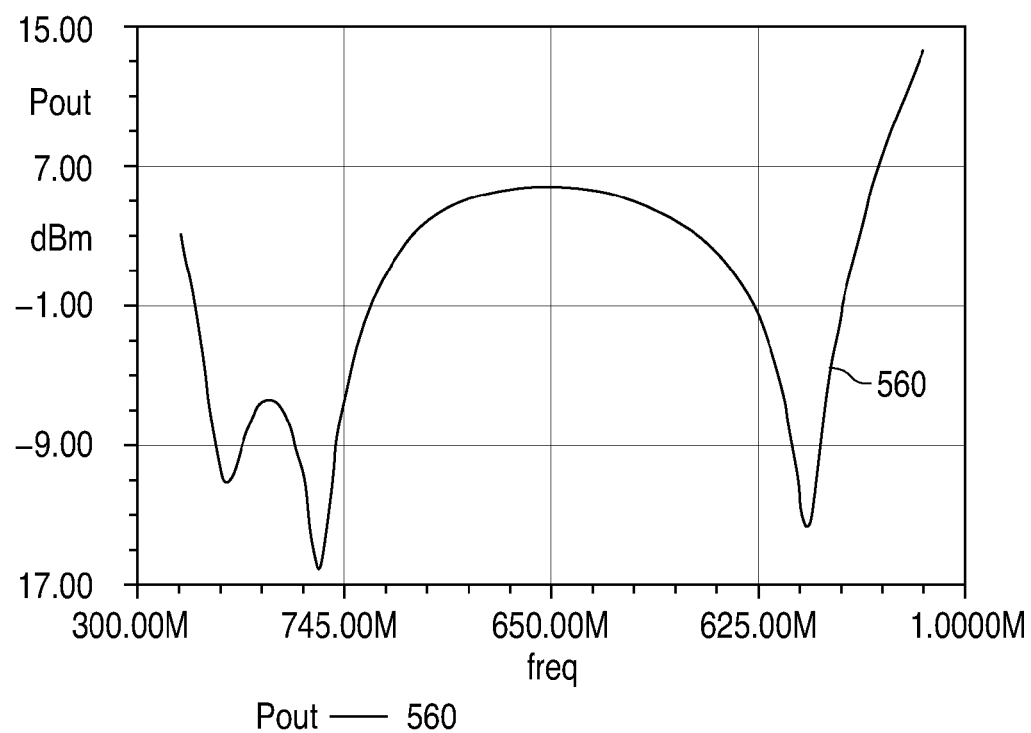
FIG. 24 is a response curve illustrating the response of the circuit of FIG. 22 for the common mode $2^{nd}$ harmonic signal when lossy elements are used in the simulation.

The simulation of the common mode suppression was repeated with real, lossy SMD elements with 0603 size. For the capacitances, series LRC models were applied, and the capacitance values were chosen from the E24 series. For the inductors, the measured S-parameters given by the manufacturer (Coilcraft) were used. FIG. 24 shows the simulated common mode suppression. As can be observed from the simulated response, the solution of the present invention also appears to operate adequately using real, lossy elements.

Figure 25:
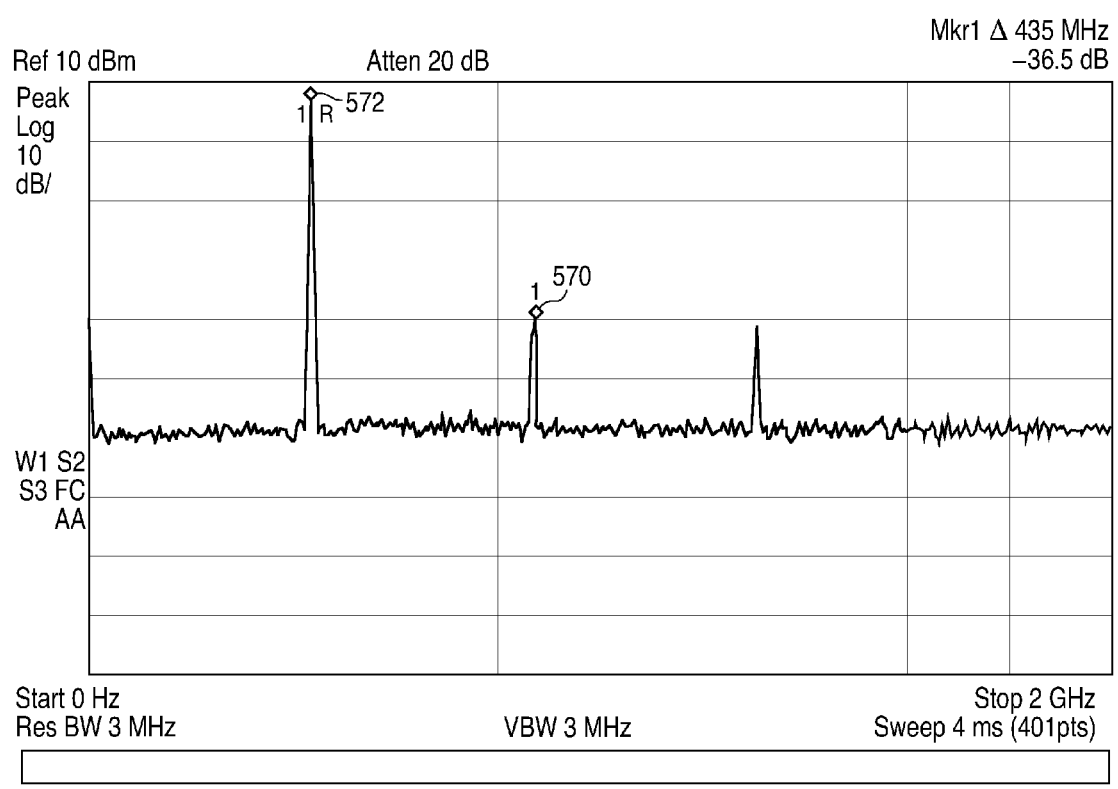
FIG. 25 is a response curve illustrating the measured response of a circuit built and tested at 436 MHz showing the second and third harmonic with the common mode suppression capacitance 270 removed.
Figure 26:
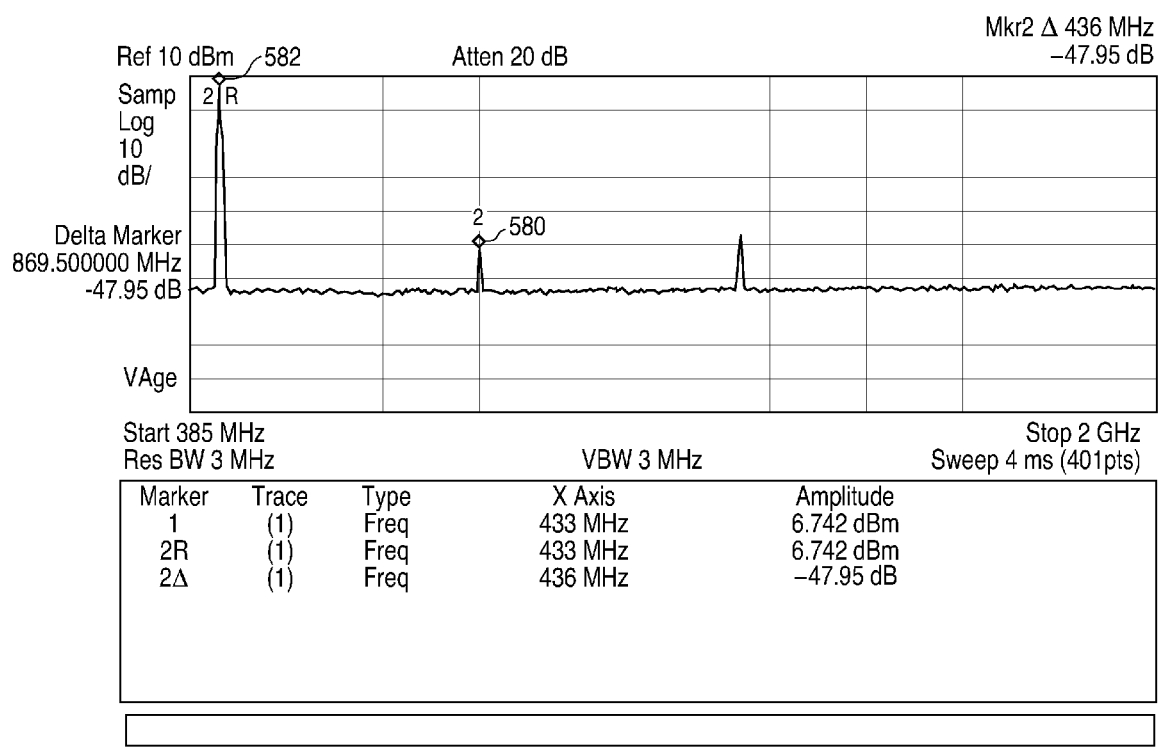
FIG. 26 is a response curve illustrating the measure response of a circuit built and tested at 436 MHz showing the second and third harmonic with the common mode suppression capacitance 270 present.

The circuit of FIG. 18 was built and tested at 435 MHz, and the $2^{nd}$ harmonic suppression was measured both with connected $C_3$ 270 capacitance (i.e. with common mode suppression at the second harmonic) and without the $C_3$ 270 capacitance (i.e. without the common mode suppression at the second harmonic). FIG. 25 shows the measured fundamental, second and third harmonic without the $C_3$ 270 capacitance. As can be observed, in this example, the second harmonic suppression is approximately 36 dBc. FIG. 26 shows the same measurement, but with the $C_3$ 270 capacitor connected (i.e. with the second harmonic suppression). The second harmonic suppression improved by approximately 12 dB to 48 dBc.

At the fundamental frequency, the design procedure of the matching network of FIG. 18 is almost identical to the procedure used for the circuit of FIG. 10. The circuit of FIG. 18 is easy to design, optimize, its phase characteristic is optimal for differential operation, and the targeted +20 dBm output power was achieved. Further, the addition of capacitance $C_3$ 270 suppresses the common mode signal at the $2^{nd}$ harmonic frequency. The resulting circuit offers high performance in a differential configuration with $2^{nd}$ harmonic suppression and a balun or symmetrical antenna.

The achievable suppression may depend on several factors. First, the common mode content to differential mode content ratio at the $2^{nd}$ harmonic frequency (in case of an ideal differential PA, only common mode second harmonic signal is present at outputs). Second, the accuracy of the tuning of the $C_3$ 270 capacitance. Due to the discrete element values, some residual difference between the resonant frequency and the $2^{nd}$ harmonic frequency may remain. One further factor is the actual loss of the applied discrete elements.

How the circuit is implemented in actual practice depends upon the frequency, the nature of the application and cost issues. Up to 5 GHz, the circuit realization can be done either with discrete SMD or printed components. Above 900 MHz, monolith integrated realization is also possible. Below 100 MHz, the realization may be done with discrete, through-hole components as well. The basic concept of the invention is independent from the way of the circuit is realized and/or components (discrete SMD, true hole, printed etc.), frequency range and application.

Figure 27:
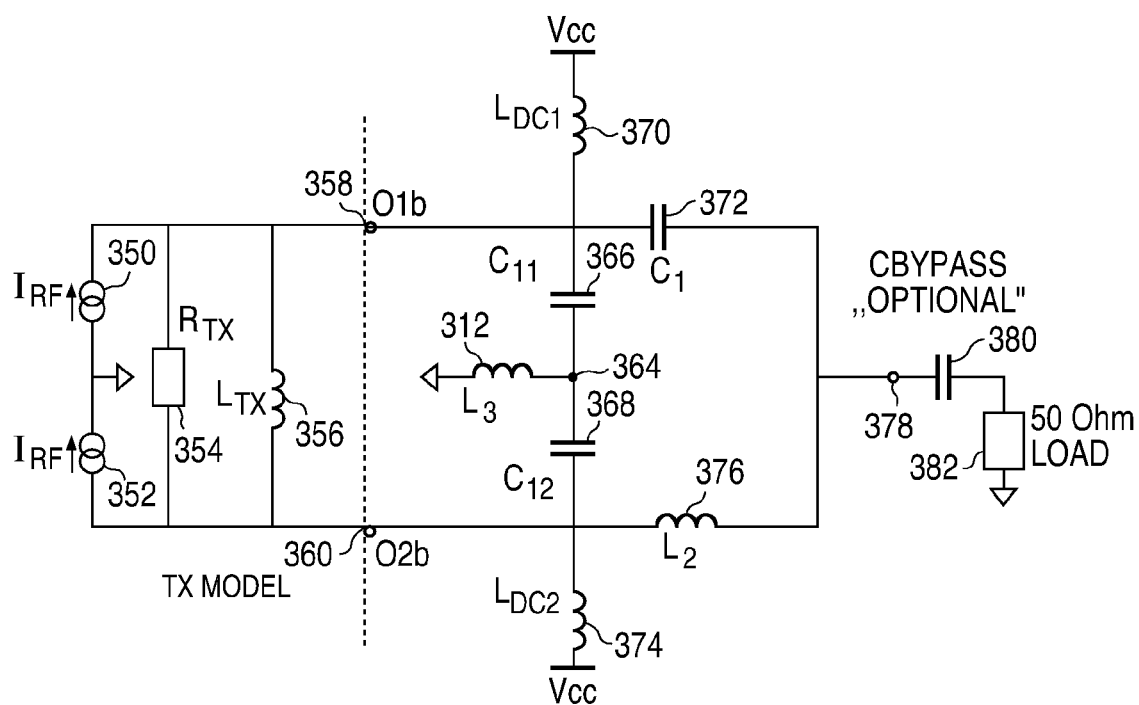
FIG. 27 is a circuit diagram of another exemplary embodiment of a circuit suitable for application to inductive output impedances.

The present invention may be applied to transmitters with inductive output impedance as well. FIG. 27 illustrates an exemplary embodiment suitable for this application. The optimization process at the fundamental frequency is the same as described above. At the $2^{nd}$ harmonic frequency, the inductor $L_3$ 362 should be adjusted to have resonance with $C_{11}$ 366 and $C_{12}$ 368 (for the common mode $C_{11}$ 366 and $C_{12}$ 368 are in parallel so the resulting capacitance is $C_{11}+C_{12}$).

All references, including publications, patent applications, and patents, cited herein are hereby incorporated by reference to the same extent as if each reference were individually and specifically indicated to be incorporated by reference and were set forth in its entirety herein.

The use of the terms "a" and "an" and "the" and similar referents in the context of describing the invention (especially in the context of the following claims) are to be construed to cover both the singular and the plural, unless otherwise indicated herein or clearly contradicted by context. Recitation of ranges of values herein are merely intended to serve as a shorthand method of referring individually to each separate value falling within the range, unless otherwise indicated herein, and each separate value is incorporated into the specification as if it were individually recited herein. All methods described herein can be performed in any suitable order unless otherwise indicated herein or otherwise clearly contradicted by context. The use of any and all examples, or exemplary language (e.g., "such as") provided herein, is intended merely to better illuminate the invention and does not pose a limitation on the scope of the invention unless otherwise claimed. No language in the specification should be construed as indicating any non-claimed element as essential to the practice of the invention.

Preferred embodiments of this invention are described herein, including the best mode known to the inventors for carrying out the invention. It should be understood that the illustrated embodiments are exemplary only, and should not be taken as limiting the scope of the invention.

What is claimed is:

1. A matching network, the network comprising:
   first and second differential input nodes and a single ended output node;
   a first inductor coupled between the first differential input node and a common circuit node;
   a second inductor coupled between the second differential input node and the common circuit node;
   a third inductor coupled between a first power supply rail and the common circuit node;
   a first capacitor coupled between the first differential input node and the single ended output node;
   a second capacitor coupled between the second differential input node and a radio frequency ground node;
   a fourth inductor coupled between the second differential input node and the single ended output node;
   a third capacitor coupled between the common circuit node and the radio frequency ground node, where a capacitance of the third capacitor is selected to provide second harmonic suppression of a common mode signal present at the first and second differential input nodes.

2. The matching network of claim 1, where the radio frequency ground node further comprises a power supply rail.

3. A method for suppressing a harmonic frequency in a matching network, the method comprising the steps of:
   impedance matching first and second differential input nodes to a single ended output node using a first reactive impedance selected to pass a resonant frequency; and
   suppressing a harmonic frequency of a common mode signal presented at the first and second differential input nodes by providing a series resonance from the first and second differential input nodes to a radio frequency ground potential through a series resonance circuit, where the series resonance is selected to pass the harmonic frequency to the radio frequency ground potential;
   wherein the series resonance circuit comprises:
      a first inductor coupled between the first differential input node and a common circuit node,
      a second inductor coupled between the second differential input node and the common circuit node, and
      a first capacitor coupled between the common circuit node and the radio frequency ground node; and
   wherein the matching network further comprises:
      a third inductor coupled between a first power supply rail and the common circuit node,
      a second capacitor coupled between the first differential input node and the single ended output node,
      a third capacitor coupled between the second differential input node and a radio frequency ground node, and
      a fourth inductor coupled between the second differential input node and the single ended output node.

* * * * *